(12) United States Patent
Chang et al.

(10) Patent No.: US 6,455,433 B1
(45) Date of Patent: Sep. 24, 2002

(54) METHOD FOR FORMING SQUARE-SHOULDERED SIDEWALL SPACERS AND DEVICES FABRICATED

(75) Inventors: Yao-Chi Chang, Tai-nan; Kao-Ming Lu, Taipei, both of (TW)

(73) Assignee: Taiwan Semiconductor Manufacturing Co., Ltd., Hsin Chu (TW)

(*) Notice: Subject to any disclaimer, the term of this patent is extended or adjusted under 35 U.S.C. 154(b) by 0 days.

(21) Appl. No.: 09/821,987

(22) Filed: Mar. 30, 2001

(51) Int. Cl.[7] .............................................. H01L 21/00
(52) U.S. Cl. ........................ 438/692; 216/38; 216/79; 216/99; 257/368; 257/632; 257/649; 438/724; 438/744; 438/745; 438/757
(58) Field of Search ................................ 438/366, 692, 438/696, 719, 723, 724, 735, 742, 743, 744, 745, 754, 756, 757; 216/38, 88, 79, 99; 257/288, 368, 382, 632, 649, 752, 754

(56) References Cited

U.S. PATENT DOCUMENTS

| | | | | |
|---|---|---|---|---|
| 5,759,920 A | * | 6/1998 | Burns et al. | 438/734 X |
| 5,776,822 A | * | 7/1998 | Fujii et al. | 438/755 X |
| 5,795,830 A | * | 8/1998 | Cronin et al. | 438/757 X |
| 5,937,301 A | * | 8/1999 | Gardner et al. | 438/724 X |
| 5,937,319 A | * | 8/1999 | Xiang et al. | 438/755 X |

* cited by examiner

Primary Examiner—William A. Powell
(74) Attorney, Agent, or Firm—Tung & Associates

(57) ABSTRACT

A method for forming sidewall spacers with square shoulders on polysilicon gates and the structure formed by the method are disclosed. In the method, a polysilicon gate is first formed on a silicon substrate wherein the gate has a silicon nitride pad on top. A conformal silicon nitride layer is then blanket deposited on top of the structure followed by the deposition of a silicon oxide layer on top of the conformal silicon nitride layer. The silicon oxide layer is then planarized until a top of the conformal silicon nitride layer is exposed. The conformal silicon nitride layer and the silicon nitride pad are then wet etched away to expose the polysilicon gate by using the silicon oxide layer as a mask. After a photoresist layer is coated and etched-back such that only a cavity formed by the silicon oxide layer, the polysilicon gate and the conformal silicon nitride layer is filled with the photoresist, the silicon oxide layer is wet etched away by an etchant such as HF. The square-shouldered sidewall spacers are then formed by first anisotropically etching the first silicon nitride layer not masked by the photoresist layer and then by a wet etching step to remove the photoresist layer.

15 Claims, 3 Drawing Sheets

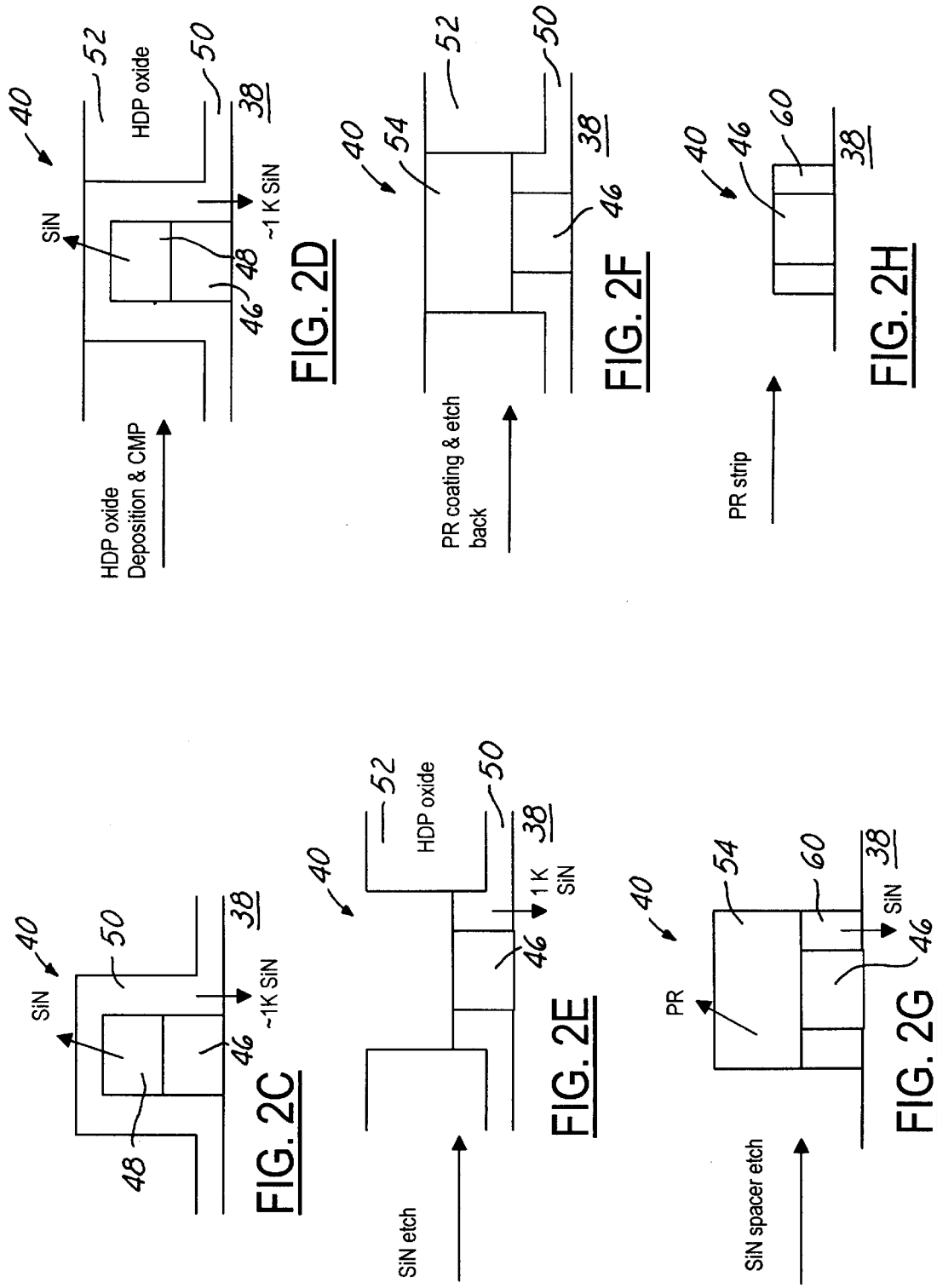

METHOD FOR FORMING SQUARE-SHOULDERED SIDEWALL SPACERS AND DEVICES FABRICATED

FIELD OF THE INVENTION

The present invention generally relates to a method for forming sidewall spacers for insulating polysilicon gates and devices formed and more particularly, relates to a method for forming dielectric sidewall spacers with square shoulders on polycide gates for eliminating electrical shorting problems between the polysilicon gate and source/drain silicide in the semiconductor structure and devices fabricated by the method.

BACKGROUND OF THE INVENTION

Modern semiconductor devices are built on semiconducting substrates such as silicon substrates that have $P^+$ and $N^+$ type doped regions in the substrates as basic elements of the device. These doped regions must be connected in a specific configuration to form a desired circuit. The circuit needs to be accessible to the outside world through conducting pads for testing and through bonding into a packaged chip. To form a semiconductor circuit, at least one layer of a conducting material such as metal must be deposited and patterned to form contacts and interconnects between the different regions of the chip. For instance, in a typical semiconductor fabrication process, a silicon wafer is first covered with an insulating layer and then, patterned and etched for contact openings in the insulating layer. A conductive material is then deposited and defined to form contact plugs and interconnecting leads.

On top of the silicon wafer, semiconductor gates are normally formed of a polysilicon material with a thin gate oxide layer formed in-between the polysilicon gate and the silicon substrate. A typical semiconductor gate structure 10 is shown in FIGS. 1A and 1B. In order to insulate the polysilicon gate 12, a silicon oxide layer 14 or any other dielectric material layer such as silicon nitride or silicon oxynitride can also be used. A thick silicon oxide layer of several thousand angstrom thickness can be deposited by a rapid thermal chemical vapor deposition (RTCVD) technique. In the process of forming such sidewall spacers 16 from the dielectric layer 14, it is important that the material deposited, i.e. silicon oxide, must have both a high deposition rate such that a thick layer can be deposited in a short period of time and also a good conformability such that the polysilicon gate can be completely covered. For instance, when silicon oxide is deposited, the TEOS (tetra-ethoxy-silane) chemistry can be used at a high deposition temperature of 800° C. for achieving a deposition rate of about 1000 Å/min. Such a high deposition rate would satisfy a throughput requirement for the semiconductor device. The high deposition temperature limits such deposition process to the front end of the fabrication process wherein metal wiring layers are not involved.

After the conformal deposition of the silicon oxide layer 14 to approximately 5000~8000 Å thickness, a reactive ion etching (RIE) method is conventionally used to pattern the gate sidewall spacers 16. The RIE technique is chosen since the anisotropic plasma used in the technique is effective in forming the sidewall spacers 16 on the gate 12. In the RIE technique, positive plasma ions in a parallel-plate RF reactor are used to provide a source of energetic particle bombardment for the etched surface, producing vertical edges in the etched film with negligible undercutting. The ion bombardment increases the reaction rate of spontaneously occurring processes and prompts reactions which do not occur without radiation. In a typical reactive ion etching system, the wafers are placed on the powered electrode of a parallel-plate RF reactor wherein horizontal surfaces are subjected to both reactant species and impinging ions, while vertical sidewalls are only subjected to reactive species.

In the conventional method of patterning sidewall spacers by the reactive ion etching method, it has been discovered that the plasma ions bombarded during the etching process damage the silicon surface at the source/drain area that will enhance dark current (or leakage current) and impact the signal/noise ratio of a photoelectronic device. As shown in FIG. 1B, a surface layer 18 of the silicon substrate 20 in the source/drain area 22, 24 is it frequently damaged by the plasma ions and severely effects the reliability of the device fabricated.

A method for fabricating a conventional sidewall spacer on a polysilicon gate structure is shown in FIGS. 1A~1E. FIGS. 1A and 1B show a polysilicon gate formation and LDD implant, respectively. For instance, in FIG. 1A, the semiconductor structure 10 is first formed on a silicon substrate 12 a thin gate oxide layer 14 having a thickness of less than 200 Å. Birds beak isolation 16 of silicon oxide are also formed for isolation of devices. On top of the gate oxide layer 14, is then deposited a doped polysilicon layer 18 and a TiN layer 20, sequentially. The semiconductor structure 10 is then patterned and a polysilicon gate 22 with a titanium silicide layer 24 on top is then formed insulated by sidewall spacers 26 formed of a dielectric material of either $SiO_2$ or $Si_3N_4$. This is shown in FIG. 1B. The LDD (lightly doped drain) implantation is performed in the source/drain regions 28, 30.

In the next step of the process, a cobalt layer 32 is blanket deposited on top of the semiconductor structure 10 by a technique such as sputtering. This is shown in FIG. 1C. The cobalt layer 32 and the silicon substrate 12 then reacts when annealed at a high temperature to form source/drain silicide layers 34, 36 of cobalt silicide, as shown in FIG. 1D. The unreacted cobalt layer 32 is then removed in a wet etch process with titanium silicide layer 24 remaining on the polysilicon gate 22. This is shown in FIG. 1E.

As shown in FIGS. 1A~1E, the most frequently used metal silicide material is $TiSi_2$, however, other metal silicides such as $CoSi_2$ and $NiSi_2$ have also been used in forming polycide gates. The titanium silicide layer is normally formed by a two-stage annealing method. A thin layer of titanium is first sputtered or deposited by a chemical vapor deposition technique, or a titanium/silicon layer can be deposited by a co-sputtering technique. A first stage annealing process is then conducted at about 650° C. such that titanium metal reacts with silicon substrate that it contacts to form titanium silicide. At this stage, the titanium silicide formed is the higher resistance value C49 phase. The unreacted titanium metal is then removed by a basic solution such as a solution of 5:1:1 DiW, 30% $H_2O_2$, $NH_4OH$. During the same etching process, the silicon oxide surface layer formed is also removed. The semiconductor structure is then annealed in a second stage at 800° C. in a nitrogen containing gas. During the second stage annealing, the titanium silicide of higher resistance value C49 phase is transformed to a lower resistance value C54 phase such that the lowest sheet resistance can be achieved.

In the conventional sidewall spacers 26 shown in FIG. 1E, the thickness is limited such that electrical shorting between the polysilicon gate 22 and the source/drain silicide 34, 36 frequently occurs. Such electrical shorting can cause serious damages to the semiconductor structure and thus greatly reduces its reliability.

It is therefore an object of the present invention to provide a method for forming sidewall spacers on a polysilicon gate without the drawbacks or shortcomings of the conventional method.

It is another object of the present invention to provide a method for forming sidewall spacers on a polysilicon gate wherein the spacers do not have a tapered shoulder region.

It is a further object of the present invention to provide a method for forming sidewall spacers on a polysilicon gate wherein the spacers are equipped with square shoulders.

It is another further object of the present invention to provide a method for forming sidewall spacers with square shoulders such that the possibility of electrical shorting between the polysilicon gate and the source/drain silicide is eliminated.

It is still another object of the present invention to provide a method for forming sidewall spacers with square shoulders on polysilicon gates by using a photoresist layer for shielding the sidewall spacers during the spacer formation process.

It is yet another object of the present invention to provide a semiconductor structure that has a polysilicon gate and a square-shouldered sidewall spacer surrounding the gate.

It is still another further object of the present invention to provide a semiconductor structure that has a polysilicon gate insulated by a square-shouldered sidewall spacer surrounding the gate and a source/drain silicide region.

It is yet another further object of the present invention to provide a semiconductor structure that has a polysilicon gate insulated by a square-shouldered sidewall spacer formed of $SiO_2$, SiON or $Si_3N_4$.

SUMMARY OF THE INVENTION

In accordance with the present invention, a method for forming sidewall spacers with square shoulders on polysilicon gates and devices formed by the method are provided.

In a preferred embodiment, a method for forming sidewall spacers with square shoulders on polycide gates can be carried out by the operating steps of first providing a silicon substrate that has an active surface; depositing a polysilicon layer on the active surface of the substrate; depositing a first silicon nitride layer on the polysilicon layer; defining and forming a polysilicon gate with a silicon nitride pad on top; depositing a conformal silicon nitride layer overlaying the polysilicon gate and the silicon nitride pad; depositing a silicon oxide layer on top of the conformal silicon nitride layer; planarizing the silicon oxide layer until a top of the conformal silicon nitride layer is exposed; wet etching the conformal and the first silicon nitride layers exposing the polysilicon gate by using the silicon oxide layer as a photomask; coating a photoresist layer and etching-back such that only a cavity formed by the silicon oxide layer, the polysilicon gate and the conformal silicon nitride layer is filled with the photoresist; wet etching away the silicon oxide layer; and forming the square-shouldered sidewall spacers by a first anisotropic etching step for removing the first silicon nitride layer not masked by the photoresist layer and then by a second wet etching step removing the photoresist layer.

The method for forming sidewall spacers with square shoulders on polycide gates may further include the step of depositing the first silicon nitride layer to a thickness between about 1500 Å and about 5000 Å, or the step of depositing the conformal silicon nitride layer to a thickness smaller than a thickness of the first silicon nitride layer, or the step of depositing the conformal silicon nitride layer to a thickness smaller than 1500 Å. The method may further include the step of planarizing the silicon oxide layer by a chemical mechanical polishing technique. The method may further include the step of wet etching the conformal and the first silicon nitride layers by $H_3PO_4$. The first anisotropic etching step may be carried out by reactive ion etching or by plasma etching. The second wet etching step may be carried out by $H_2SO_4/H_2O_2$ wet etching.

The present invention is further directed to a semiconductor structure that includes a silicon substrate; a gate oxide layer on top of the silicon substrate; a polysilicon gate on the gate oxide layer; a metal silicide layer overlaying the polysilicon gate; and a square-shouldered sidewall spacer surrounding the polysilicon gate.

The semiconductor structure may further include a metal silicide layer overlaying a source region and a drain region of the semiconductor structure. The gate oxide layer may be less than 200 Å thick. The metal silicide may be selected from the group consisting of tungsten silicide, cobalt silicide, titanium silicide and tantalum silicide. The square-shouldered sidewall spacer may be formed of a dielectric material, or a material selected from the group consisting of $SiO_2$, SiON and $Si_3N_4$. The metal silicide layer may be formed of a material selected from the group consisting of tungsten silicide, cobalt silicide, titanium silicide and tantalum silicide.

BRIEF DESCRIPTION OF THE DRAWINGS

These and other objects, features and advantages of the present invention will become apparent from the following detailed description and the appended drawings in which:

FIG. 2C is an enlarged, cross-sectional view of the present invention semiconductor structure of FIG. 2B with a conformal silicon nitride layer blanket deposited on top.

FIG. 2D is an enlarged, cross-sectional view of the present invention semiconductor structure of FIG. 2C with a silicon oxide layer deposited and planarized on top.

FIG. 2E is an enlarged, cross-sectional view of the present invention semiconductor structure of FIG. 2D with the silicon nitride layer etched away by using the oxide layer as a mask.

FIG. 2F is an enlarged, cross-sectional view of the present invention semiconductor structure of FIG. 2E with a photoresist coating deposited and etched-back.

FIG. 2G is an enlarged, cross-sectional view of the present invention semiconductor structure of FIG. 2F with the silicon nitride spacer etched and the oxide layer removed.

FIG. 2H is an enlarged, cross-sectional view of the present invention semiconductor structure of FIG. 2G with the photoresist layer on top of the polysilicon gate and the square-shouldered spacers removed.

DETAILED DESCRIPTION OF THE PREFERRED EMBODIMENT

The present invention discloses a method for forming sidewall spacers with square shoulders on polysilicon gates such that electrical shorting problems between the gate and the source/drain silicide regions on spacers formed with tapered shoulders can be eliminated. The method utilizes an additional deposition step of a photoresist layer on top of the polysilicon gate such that the photoresist layer functions as a photomask during the spacer formation process and thus preventing the shoulder portions of the spacer from being etched away.

The present invention further discloses a semiconductor structure that includes a silicon substrate; a gate oxide layer on top of the substrate; a polysilicon gate formed on the gate oxide layer; a metal silicide layer overlaying the polysilicon gate; and a square-shouldered sidewall spacer surrounding the polysilicon gate. The structure may further include a metal silicide layer overlaying a source region and a drain region of the structure.

The present invention novel method for etching square-shouldered sidewall spacers formed of silicon nitride or any other dielectric material provides two major benefits. First, the thickness of the sidewall spacers can be accurately controlled without being affected by the dry etch process in forming the spacers. Secondly, the profile of the sidewall spacers, i.e. the square-shouldered profile of the spacers, can be accurately controlled to provide improved insulation between the polysilicon gate and the source/drain silicide regions. The present invention further utilizes a high density plasma oxide CMP after silicon nitride spacer etch for defining the thickness of the sidewall spacers. The silicon nitride etch and the photoresist etch-back to automatically define the spacer photolithographic step. By utilizing the present invention novel method, the silicon nitride spacer can be etched to obtain desirable thickness and profile of the spacer. It was discovered that the square-shouldered sidewall spacers can efficiently prevent salicide bridge between the polysilicon gate and the source/drain silicide regions.

The present invention novel method is shown in FIGS. 2A~2H which illustrate the following major processing steps:

1. 2K Å SiN deposition after polysilicon deposition;
2. Hard mask open and polysilicon etch;
3. 1K Å SiN deposition;
4. 5K Å HDP oxide deposition;
5. Oxide CMP to stop on SiN;
6. Dry or wet SiN etch to polytub (high selectivity to oxide and poly);
7. 3K Å photoresist coating;
8. Photoresist etch-back to stop on HDP oxide;
9. Wet etch oxide to remove HDP oxide;
10. 1K Å SiN dry etch; and
11. Photoresist strip.

Figure 1A:
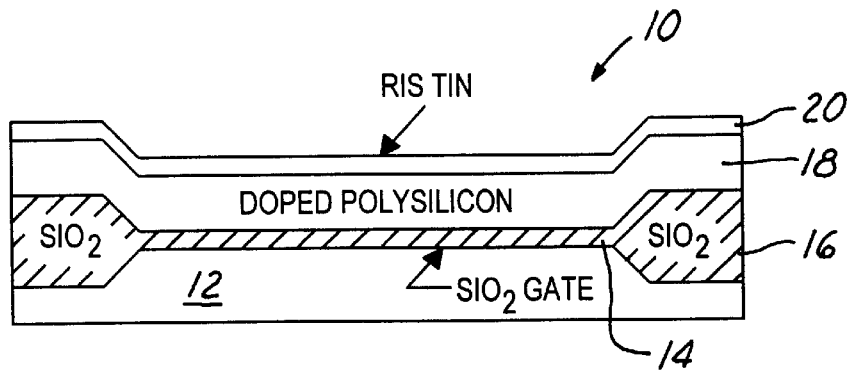
FIG. 1A is an enlarged, cross-sectional view of a conventional semiconductor structure having a gate oxide layer, a doped polysilicon layer and a TiN layer deposited on top.
Figure 1B:
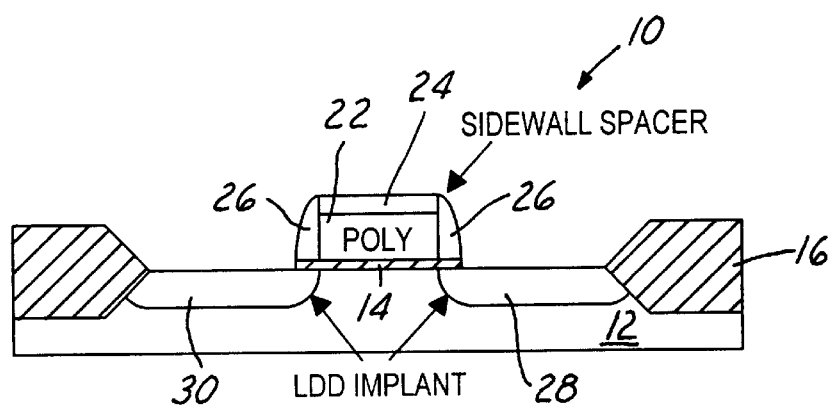
FIG. 1B is an enlarged, cross-sectional view of the conventional semiconductor structure of FIG. 1A with the polysilicon/titanium silicide gate formed insulated by sidewall spacers.
Figure 1C:
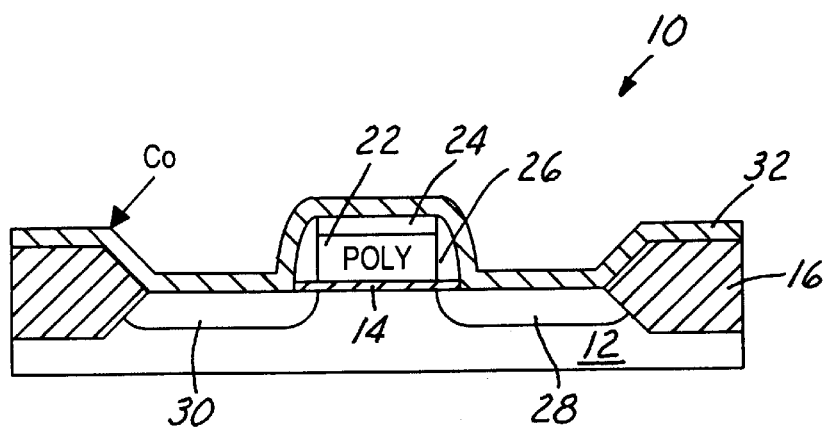
FIG. 1C is an enlarged, cross-sectional view of the conventional semiconductor structure of FIG. 1B with a Co layer sputtered on top.
Figure 1D:
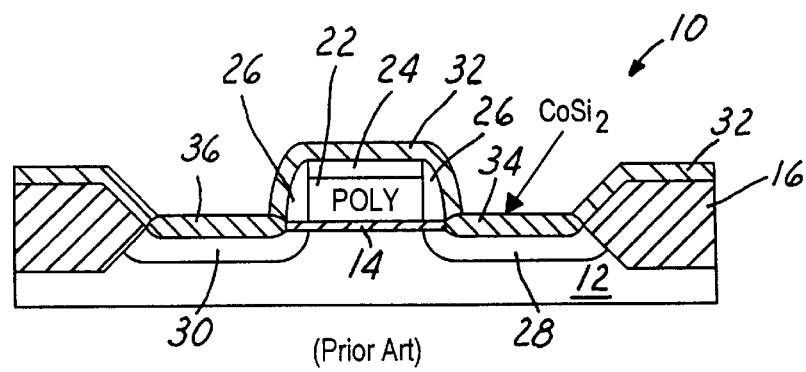
FIG. 1D is an enlarged, cross-sectional view of the conventional semiconductor structure of FIG. 1C after an annealing process for forming $CoSi_2$ at the source/drain regions.
Figure 1E:
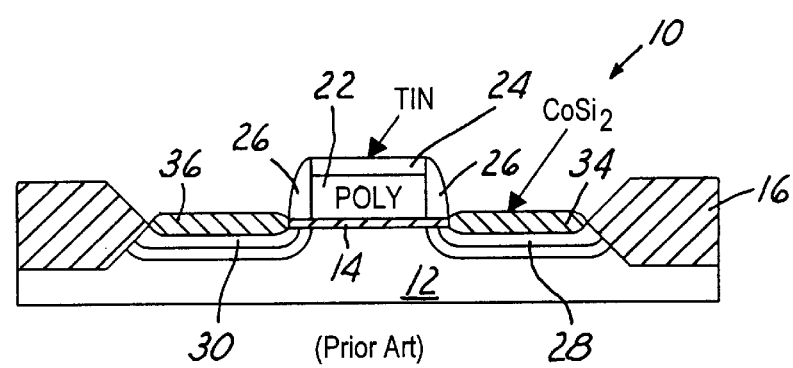
FIG. 1E is an enlarged, cross-sectional view of the conventional semiconductor structure of FIG. 1D with the unreacted Co layer removed by a wet etching process.
Figure 2A:
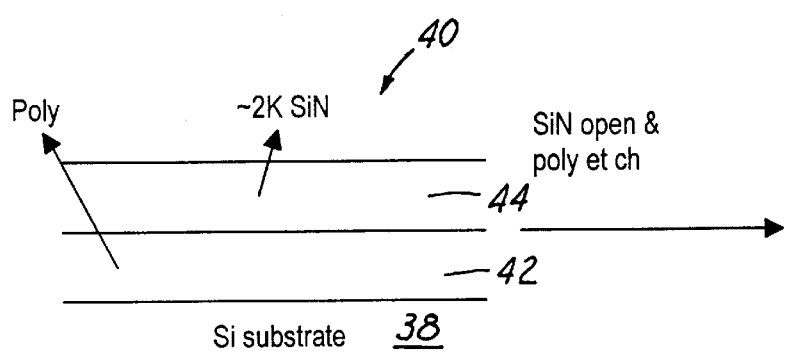
FIG. 2A is an enlarged, cross-sectional view of the present invention semiconductor structure with a polysilicon layer and a silicon nitride layer sequentially deposited on top of a silicon substrate.
Figure 2B:
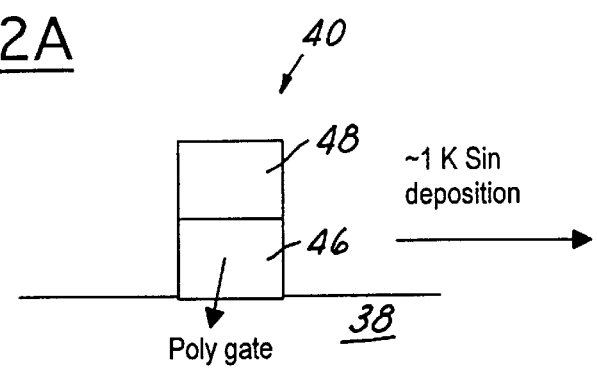
FIG. 2B is an enlarged, cross-sectional view of the present invention semiconductor structure of FIG. 2A with the polysilicon gate patterned and formed.

Referring now to FIG. 2A wherein a present invention semiconductor structure 40 is shown with a polysilicon layer 42 and a 2000 Å silicon nitride layer 44 sequentially deposited on a silicon substrate 38. The silicon nitride layer is then opened and the polysilicon layer 42 is etched by a high density plasma method to form the polysilicon gate 46 with a silicon nitride pad 48 on top. This is shown in FIG. 2B.

In the next step of the process, as shown in FIG. 2C, a silicon nitride layer 50 having a thickness of about 1000 Å is then blanket deposited on top of the polysilicon gate 46. A high density plasma deposited oxide layer 52 on top of the semiconductor structure 40 is then planarized by a chemical mechanical polishing method, as shown in FIG. 2D. The HDP oxide layer 52 is then used as a mask in a silicon nitride etching process for removing partially the silicon nitride layer 50 and the silicon nitride pad 48, as shown in FIG. 2E.

In the next step of the process, shown in FIG. 2F, a photoresist coating layer 54 is applied on top of the semiconductor structure 40 and then etched-back to form a planar surface on top. The process is then followed by the step of silicon nitride spacer etch in forming the spacer 60 surrounding the polysilicon gate 46. During the spacer etch process, the photoresist layer 54 is used as a mask to shield the sidewall spacer 60 from being damaged by the dry etch process, i.e. by reactive ion etching. In the final step of the process, as shown in FIG. 2H, the photoresist layer is stripped in a wet etching process to produce the final structure of a polysilicon gate 46 surrounded by a square-shouldered sidewall spacer 60 on top of the silicon substrate 38. The wet etching process can be carried out in an etchant of $H_2SO_4/H_2O_2$ mixture.

The present invention novel method for forming sidewall spacers with square shoulders on polysilicon gates and the structure formed by the method have therefore been amply described in the above description and in the appended drawings of FIGS. 2A~2H.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for forming sidewall spacers with square shoulders on polycide gates comprising the steps of:

providing a silicon substrate having an active surface;

depositing a polysilicon layer on the active surface of the substrate;

depositing a first silicon nitride layer on said polysilicon layer;

defining and forming a polysilicon gate with a silicon nitride pad on top;

depositing a conformal silicon nitride layer overlaying said polysilicon gate and said silicon nitride pad;

depositing a silicon oxide layer on top of said conformal silicon nitride layer;

planarizing said silicon oxide layer until a top of said conformal silicon nitride layer is exposed;

wet etching said conformal and said first silicon nitride layers exposing said polysilicon gate by using said silicon oxide layer as a mask;

coating a photoresist layer and etching-back such that only a cavity formed by said silicon oxide layer, said polysilicon gate and said conformal silicon nitride layer is filled with said photoresist;

wet etching away said silicon oxide layer; and forming said square-shouldered sidewall spacers by a first anisotropic etching step for removing said first silicon nitride layer not masked by said photoresist layer and by a second wet etching step removing said photoresist layer.

2. A method for forming sidewall spacers with square shoulders on polycide gates according to claim 1 further comprising the step of depositing said first silicon nitride layer to a thickness between about 1500 Å and about 5000 Å.

3. A method for forming sidewall spacers with square shoulders on polycide gates according to claim 1 further comprising the step of depositing said conformal silicon nitride layer to a thickness smaller than a thickness of said first silicon nitride layer.

4. A method for forming sidewall spacers with square shoulders on polycide gates according to claim 1 further comprising the step of depositing said conformal silicon nitride layer to a thickness smaller than 1500 Å.

5. A method for forming sidewall spacers with square shoulders on polycide gates according to claim 1 further comprising the step of planarizing said silicon oxide layer by a chemical mechanical polishing technique.

6. A method for forming sidewall spacers with square shoulders on polycide gates according to claim 1 further comprising the step of wet etching said conformal and said first silicon nitride layers by $H_3PO_4$.

7. A method for forming sidewall spacers with square shoulders on polycide gates according to claim 1, wherein said first anisotropic etching step being carried out by reactive ion etching or by plasma etching.

8. A method for forming sidewall spacers with square shoulders on polycide gates according to claim 1, wherein said second wet etching step being carried out by $H_2SO_4/H_2O_2$ wet etching.

9. A semiconductor structure comprising:

a silicon substrate;

a gate oxide layer on top of said silicon substrate;

a polysilicon gate on said gate oxide layer;

a metal silicide layer overlaying said polysilicon gate; and a square-shouldered sidewall spacer surrounding said polysilicon gate.

10. A semiconductor structure according to claim 9 further comprising a metal silicide layer overlaying a source region and a drain region of said semiconductor structure.

11. A semiconductor structure according to claim 9, wherein said gate oxide layer being less than 200 Å thick.

12. A semiconductor structure according to claim 9, wherein said metal silicide is selected from the group consisting of tungsten silicide, cobalt silicide, titanium silicide and tantalum silicide.

13. A semiconductor structure according to claim 9, wherein said square-shouldered sidewall spacer being formed of a dielectric material.

14. A semiconductor structure according to claim 9, wherein said square-shouldered sidewall spacer being formed of a dielectric material selected from the group consisting of $SiO_2$, SiON and $Si_3N_4$.

15. A semiconductor structure according to claim 10, wherein said metal silicide layer being formed of a material selected from the group consisting of tungsten silicide, cobalt silicide, titanium silicide and tantalum silicide.

* * * * *